(12) United States Patent
Sagesaka

(10) Patent No.: US 7,707,020 B2
(45) Date of Patent: Apr. 27, 2010

(54) SIMULATION METHOD, SIMULATION APPARATUS, AND COMPUTER READABLE MEDIUM STORING SIMULATION PROGRAM

(75) Inventor: Hiroshi Sagesaka, Tenri (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 462 days.

(21) Appl. No.: 11/822,858

(22) Filed: Jul. 10, 2007

(65) Prior Publication Data
US 2008/0021690 A1 Jan. 24, 2008

(30) Foreign Application Priority Data
Jul. 11, 2006 (JP) .............................. 2006-190548

(51) Int. Cl.
G06F 17/50 (2006.01)

(52) U.S. Cl. ............................................ 703/14; 703/2

(58) Field of Classification Search ................... 703/2, 703/13, 14; 375/222; 370/249; 379/417
See application file for complete search history.

(56) References Cited

U.S. PATENT DOCUMENTS

| | | | |
|---|---|---|---|
| 6,885,746 B2* | 4/2005 | Hausman et al. ............ | 379/417 |
| 6,999,583 B2* | 2/2006 | Valenti et al. .............. | 379/417 |
| 7,593,458 B2* | 9/2009 | Cioffi ......................... | 375/222 |
| 2003/0112967 A1* | 6/2003 | Hausman et al. ............ | 379/417 |
| 2005/0105473 A1* | 5/2005 | Hausman et al. ............ | 370/249 |

FOREIGN PATENT DOCUMENTS

JP        2004-54642 A     2/2004

OTHER PUBLICATIONS

Singh et al., R. Modeling of Electromagnetically Coupled Subsrate Noise in Flash A/D Converters, IEEE Transactions on Electromagnetic Compatibility, vol. 45, No. 2, May 2003, pp. 459-468.*
Lin et al., L. Crosstalk Versus Interline Space in Ultra High Speed Digital PCBs, IEEE International Symposium on Electromagnetic Compatibility, vol. 2, Aug. 1998, pp. 629-634.*
"Nikkei Electronics" Nikkei Business Publications, Inc., Jan. 31, 2005, pp. 117-130.

* cited by examiner

Primary Examiner—Russell Frejd
(74) Attorney, Agent, or Firm—Birch, Stewart, Kolasch & Birch, LLP

(57) ABSTRACT

A circuit analysis portion obtains an output characteristic of each of first noise source candidates. A noise evaluate portion obtains intensity of a noise crosstalking from each of the first noise source candidates to a low noise-tolerance terminal based on a second transfer function and the output characteristic of each of the first noise source candidates. Further, the first noise source candidates having the intensity of at least a prescribed value are set as second noise source candidates that are highly possibly the noise source. The analysis portion sets a noise source equivalent circuit to each of the second noise source candidates, and performs a second electromagnetic field analysis of the circuit substrate. The analysis portion sequentially repeats the second electromagnetic field analysis to every second noise source candidate. Thus, the route of the crosstalking noise can efficiently be analyzed.

5 Claims, 7 Drawing Sheets

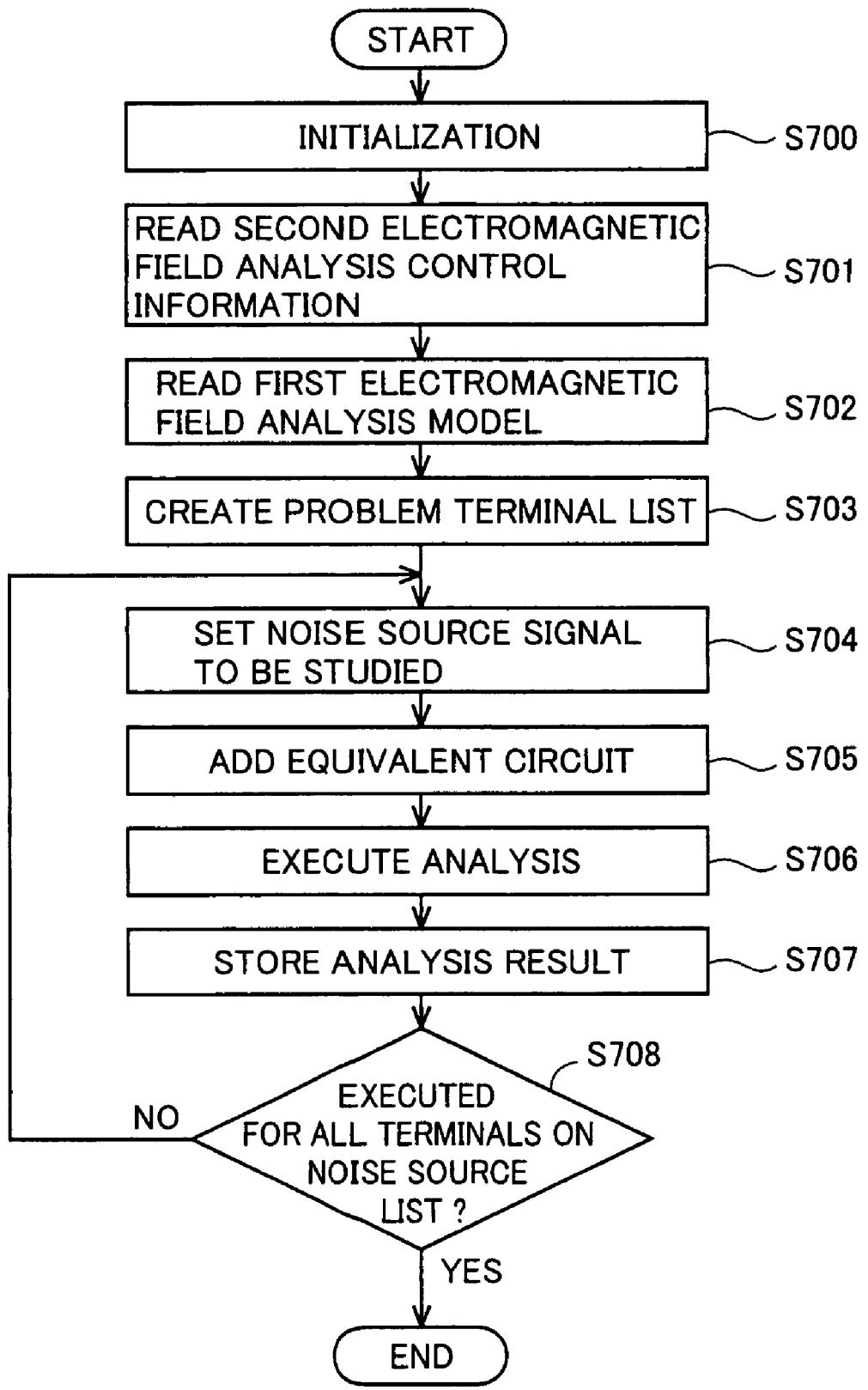

SIMULATION METHOD, SIMULATION APPARATUS, AND COMPUTER READABLE MEDIUM STORING SIMULATION PROGRAM

This nonprovisional application is based on Japanese Patent Application No. 2006-190548 filed with the Japan Patent Office on Jul. 11, 2006, the entire contents of which are hereby incorporated by reference.

BACKGROUND OF THE INVENTION

1. Field of the Invention

The present invention relates to a technique of analyzing, as to an electronic device, a route of a noise crosstalking from a plurality of noise source candidates into a terminal that have low tolerance to a noise, by electromagnetic field analysis.

2. Description of the Background Art

As the operating frequency of digital devices accelerates in recent years, problems related to noises such as malfunction of devices due to unnecessary radiation or deterioration in the quality of power supplies and signals are becoming obvious. This is attributed to an increase in an electromagnetic effect of the three-dimensional shape of the peripheral wiring such as a printed substrate associated with the acceleration of the operating frequency.

One of the noise problems is that, into an input to an analog circuit, a noise of an accelerated digital signal in the same device mixes via a route that is not intended by the designer, whereby malfunction occurs or the desired performance cannot be ensured. In designing devices, it is very effective to analyze the route of a crosstalking noise in dealing with the problem.

In conventional designing, a noise crosstalk route has been estimated through measurement of actual equipment such as a prototype. However, the measurement with the actual equipment requires various measurement techniques and complicated operations. Moreover, the measurement of a high speed signal itself is becoming more difficult, along with the acceleration of the operating frequency.

Accordingly, as methods of estimating a noise crosstalk route, attempts to employ analyzing schemes such as circuit analysis, electromagnetic field analysis and the like have been made, in place of the measurement with actual equipment. In particular, as to the electromagnetic field analysis, there are recent reports on attempts of applying three-dimensional electromagnetic field analysis having been used for designing antennas and the like to printed substrates and the like in cooperation with circuit analysis.

For example, Nikkei Electronics, Nikkei Business Publications, Inc., Jan. 31, 2005, pp. 117-130 discloses an example of dealing with noise problems on a printed substrate by using a plurality of computers to process in parallel electromagnetic field analysis by FDTD (Finite Difference Time Domain) method and circuit analysis. Japanese Patent Laying-Open No. 2004-054642 discloses a method relating to a method of accelerating the aforementioned analysis.

Although the electromagnetic field analysis is very effective in analyzing the mechanism of noise problems associated with digital devices as described in the aforementioned Nikkei Electronics, the time required for the analysis becomes enormously long as the target of analysis becomes vast and minute.

In analyzing a printed substrate or the like in which a plurality of terminals that are possibly the noise source (hereinafter also referred to as "noise source candidates") exist, it is necessary to note the following points in analyzing a noise mixing route.

When performing the electromagnetic field analysis by applying a noise simultaneously to every noise source candidate, the electromagnetic field analysis is only necessary to be performed once. However, since the effects of all the noise source candidates are overlapping, it is very difficult to specify the source of a noise crosstalking in a certain terminal.

On the other hand, when performing analysis sequentially by applying a noise in turn to every noise candidate, it is possible to analyze the route of a noise from each noise source candidate to a certain terminal. However, since the electromagnetic field analysis must be performed as many times as the number of the noise candidates, the analysis time becomes enormously long.

SUMMARY OF THE INVENTION

The present invention has been made to solve the above-described problems, and an object thereof is to provide a simulation method that efficiently analyzes the route of a crosstalking noise.

One aspect of the present invention provides a simulation method of analyzing a route of a noise crosstalking from a plurality of first noise source candidates set in advance as noise source terminals on a circuit substrate to a prescribed terminal. The method includes the steps of: obtaining, by performing a first electromagnetic field analysis of the circuit substrate, a first transfer function expressing coupling from the prescribed terminal to each of the first noise source candidates; setting, based on the first transfer function, a second transfer function expressing coupling from each of the first noise source candidates to the prescribed terminal; obtaining an output characteristic of each of the first noise source candidates; obtaining, based on the second transfer function and the output characteristic of each of the first noise source candidates, intensity of the noise crosstalking from each of the first noise source candidates to the prescribed terminal; setting the first noise source candidates having the intensity of at least a prescribed value as second noise source candidates; setting a noise source equivalent circuit to each of the second noise source candidates and performing a second electromagnetic field analysis of the circuit substrate; sequentially repeating the second electromagnetic field analysis of each of second noise source candidates; and analyzing the route of the noise crosstalking, based on results of the step of sequentially repeating the second electromagnetic field analysis.

Preferably, the step of setting the second transfer function includes a step of setting the first transfer function as a function type of the second transfer function.

Preferably, the first electromagnetic field analysis and second electromagnetic field analysis are executed by Finite Difference Time Domain method, and an impulse waveform is applied as the noise source.

Another aspect of the present invention provides a simulation apparatus performing analysis processing of a route of a noise crosstalking from a plurality of first noise source candidates set in advance as noise source terminals on a circuit substrate to a prescribed terminal. The apparatus includes: means for obtaining, by performing a first electromagnetic field analysis of the circuit substrate, a first transfer function expressing coupling from the prescribed terminal to each of the first noise source candidates; means for setting, based on the first transfer function, a second transfer function expressing coupling from each of the first noise source candidates to the prescribed terminal; means for obtaining an output characteristic of each of the first noise source candidates; means for obtaining, based on the second transfer function and the output characteristic of each of the first noise source candidates, intensity of the noise crosstalking from each of the first noise source candidates to the prescribed terminal; means for setting the first noise source candidates having the intensity of at least a prescribed value as second noise source candidates; means for setting a noise source equivalent circuit to each of the second noise source candidates and performing a second electromagnetic field analysis of the circuit substrate; means for sequentially repeating the second electromagnetic field analysis of each of the second noise source candidates; and means for analyzing the route of the noise crosstalking, based on results of the means for sequentially repeating the second electromagnetic field analysis.

Still, another aspect of the present invention provides a computer readable medium storing a simulation program for causing a computer having an operating unit to execute analysis processing of a route of a noise crosstalking from a plurality of first noise source candidates set in advance as noise source terminals on a circuit substrate to a prescribed terminal. The simulation program causes the computer to execute the steps of: obtaining, by performing a first electromagnetic field analysis of the circuit substrate, a first transfer function expressing coupling from the prescribed terminal to each of the first noise source candidates; setting, based on the first transfer function, a second transfer function expressing coupling from each of the first noise source candidates to the prescribed terminal; obtaining an output characteristic of each of the first noise source candidates; obtaining, based on the second transfer function and the output characteristic of each of the first noise source candidates, intensity of the noise crosstalking from each of the first noise source candidates to the prescribed terminal; setting the first noise source candidates having the intensity of at least a prescribed value as second noise source candidates; setting a noise source equivalent circuit to each of the second noise source candidates and performing a second electromagnetic field analysis of the circuit substrate; sequentially repeating the second electromagnetic field analysis of each of the second noise source candidates; and analyzing the route of the noise crosstalking, based on results of the step of sequentially repeating the second electromagnetic field analysis.

According to the present invention, the crosstalking route of a noise can efficiently be analyzed. Thus, the number of executing the electromagnetic field analysis can be reduced, and the analysis time can be shortened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a flowchart showing processes in a second electromagnetic field analysis.

DESCRIPTION OF THE PREFERRED EMBODIMENTS

Figure 1:
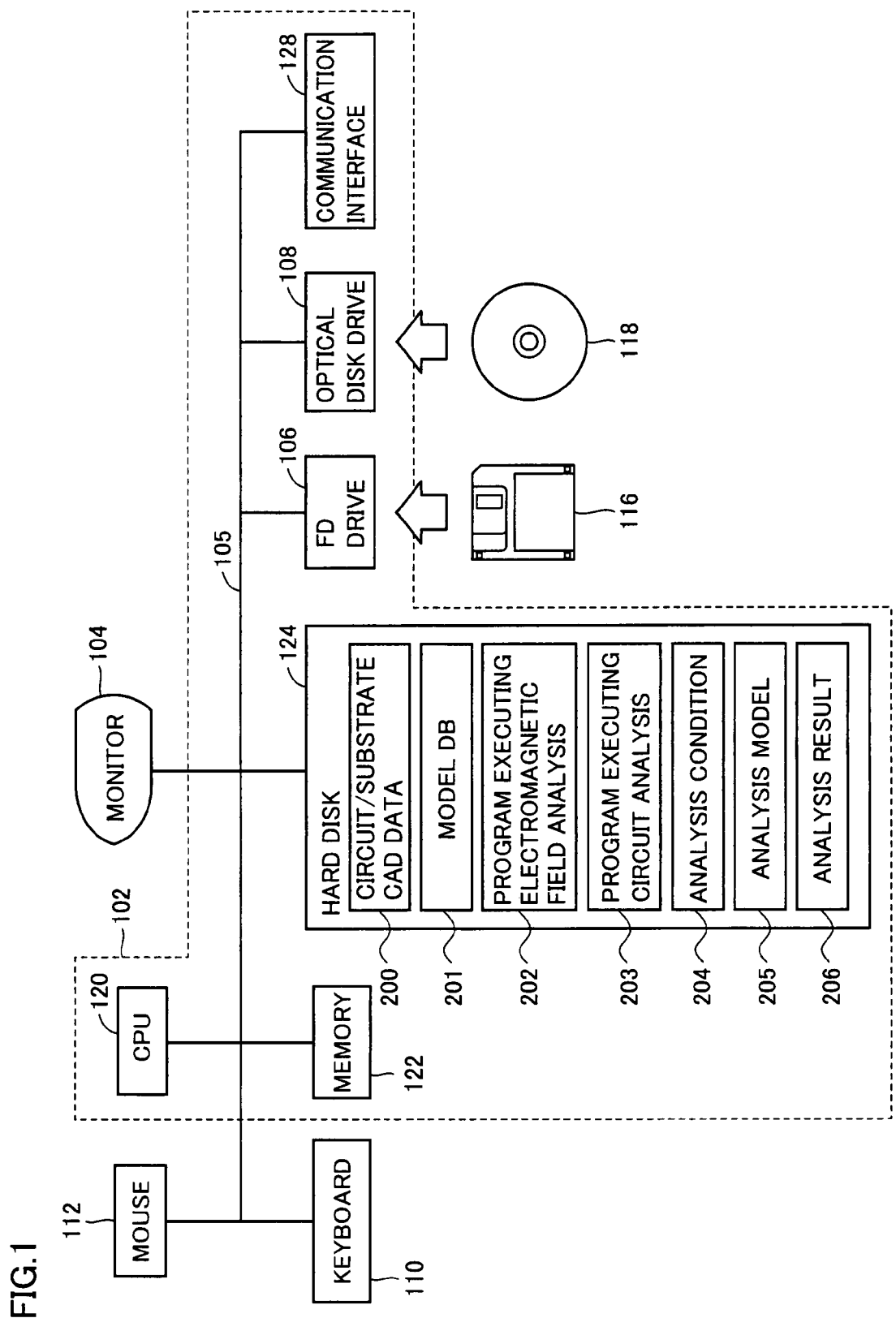
FIG. 1 is a block diagram of a configuration of a simulation apparatus 100 according to the present invention.

In the following, referring to the drawings, an embodiment of the present invention will be described. In the following description, identical components are denoted by identical reference characters. Their labels and functions are also the same. Accordingly, detailed description thereof will not be repeated.

As clarified by the following description, a simulation apparatus according to the present invention efficiently specifies the source of a noise crosstalking into a specific terminal included in the targets of an electromagnetic field analysis. This can reduce the number of execution of the electromagnetic field analysis, which is executed for specifying the noise source out of a plurality of possible noise source candidates, and can shorten the time for analyzing the route of a crosstalking noise. The simulation apparatus according to the present embodiment specifies the source of a noise to a terminal of which original function would be lost if it receives a noise, or in a terminal greatly affected by a noise (hereinafter referred to as a "low noise-tolerance terminal").

Referring to FIG. 1, a configuration of a simulation apparatus 100 according to the present invention will be described.

Simulation apparatus 100 includes a computer body 102, and as connected to computer body 102 via a bus 105, a flexible disk (hereinafter also referred to as FD) drive 106 for reading and writing information from/to FD disk 116, an optical disk drive 108 for reading information on an optical disk such as a CD-ROM (Compact Disk Read-Only Memory) 118, a communication interface 128 for externally transmitting and receiving data, a monitor 104 as a display device, and a keyboard 110 and a mouse 112 as input devices. Computer body 102 includes a CPU (Central Processing Unit) 120, memory 122 including ROM (Read Only Memory) and RAM (Random Access Memory), and a direct access memory device, for example hard disk 124.

Hard disk 124 includes circuit/substrate CAD data 200 storing parameters expressing physical properties such as the shape of the circuit substrate to be analyzed, permittivity of the medium constituting the substrate and the like, a model database (hereinafter also referred to as "model DB") 201 storing an equivalent circuit model corresponding to each component arranged on the circuit substrate, a program 202 executing an electromagnetic field analysis, a program 203 executing a circuit analysis, an analysis condition 204 storing the conditions for performing an analysis, an analysis model 205 storing an analysis model for an electromagnetic field analysis, and an analysis result 206 storing the results of analyses.

Here, for example circuit/substrate CAD data 200, model DB 201 and analysis condition 204 may be supplied from an external database via communication interface 128. The programs for performing simulations according to the present invention may be supplied by a storage medium such as FD 116 or CD-ROM 118, or may be supplied from other computers via a communication line. The electromagnetic field analysis and/or circuit analysis may be executed by an external computer via communication interface 128 so that the result is stored in hard disk 124.

CPU 120 functioning as an operation processing apparatus executes respective processes corresponding to the aforementioned programs, using memory 122 as the working memory.

It is noted that CD-ROM 118 may be any other device such as DVD-ROM (Digital Versatile Disk-ROM) or a memory card if it is a medium capable of recording information such as a program installed into the computer body. In such a case, computer body 102 is provided with a drive apparatus that can read such medium. To bus 105, a magnetic tape apparatus to which a cassette type magnetic tape is removably attached for accessing may be connected.

The program executing a simulation according to the present invention is software executed by CPU 120, as described above. Generally, such software is distributed as stored in a storage medium such as CD-ROM 118, FD 116 and the like, and read from the storage medium by optical disk drive 108, FD drive 106 and the like, to be once stored in hard disk 124. Alternatively, when computer 100 is connected to a network, it is once copied from a server on the network to hard disk 124. It is further read from hard disk 124 into RAM in memory 122, to be executed by CPU 120. It is noted that it may be directly loaded into RAM without being stored in hard disk 124 and executed, when there is a network connection.

The hardware of the computer itself and its operation principle shown in FIG. 1 are of general nature. Accordingly, in realizing the function of the present invention, the essential part is the software stored in the storage medium such as FD 116, CD-ROM 118, hard disk 124 or the like.

Next, referring to FIG. 2, a functional configuration of CPU 120 will be described.

CPU 120 is constituted of an electromagnetic field analysis portion 210 performing an electromagnetic field analysis according to program 202 executing an electromagnetic field analysis, a circuit analysis portion 220 performing a circuit analysis according to program 203 executing a circuit analysis, an analysis result study portion 203 studying the results of the electromagnetic field analysis and circuit analysis, and an analysis control portion 240 controlling each analysis.

Electromagnetic field analysis portion 210 includes a model create portion 212 creating a device analysis model, and an analysis portion 214 executing an electromagnetic field analysis.

Model create portion 212 reads CAD design data, the structure information and physical property values of each constituents from circuit/substrate CAD data 200 and/or model DB 201, to construct three-dimensional structure information. Then, it stores the constructed three-dimensional structure information in analysis model 205. For example, when the analysis target is a printed substrate, model create portion 212 reads physical property values of materials included in a substrate made of a dielectric and a substrate made of a conductor or the like, two-dimensional structure information of each material in each layer, as well as information on the structure in a layered direction (thickness direction) of the printed substrate, thereby construct the three-dimensional structure information.

Analysis portion 214 reads analyze condition 204 and analyze model 205 and performs an electromagnetic field analysis. It writes the analysis result to analysis result 206. In the present embodiment, an electromagnetic field analysis according to the FDTD method is performed. In the FDTD method, an analysis is performed with a structure referred to as Yee grid that displaces a grid for arranging an unknown electric field and a grid for arranging an unknown magnetic field by half the width of the grids. The FDTD method is an analysis scheme in which a relational expression describing interaction between these unknown electric and magnetic fields and the adjacent unknown electric and magnetic fields is derived by differentiating Maxwell's electromagnetic field analysis equation, based on which the unknown electric and magnetic fields are updated on a certain time-step basis, whereby the entire electromagnetic field behavior is obtained. According to the analysis scheme, the electric field and the magnetic field can be obtained alternately, by updating the electric field at a certain time step, updating the magnetic field after ½ time steps, and updating the electric field after one time step.

Analysis condition 204 includes the names of signals in a low noise-tolerance terminal and noise source candidate terminals, the size of grid cells, a time step of the FDTD analysis and the like.

Circuit analysis portion 220 reads substrate CAD data storing a wiring structure of noise source candidate signals as well as equivalent circuits of elements related to the signals from circuit/substrate CAD data 200 and/or model DB 201, and executes a circuit analysis. Then, it calculates the output characteristics of the noise source candidates and writes them to analysis result 206.

Analysis result study portion 230 includes a transfer function derive portion 232 and a noise evaluate portion 234.

Transfer function derive portion 232 reads from analysis result 206 the voltage and current values of the low noise-tolerance terminal and the noise source candidate terminals, and calculates a first transfer function from the low noise-tolerance terminal to each noise source candidate terminal. Next, using the first transfer function, it sets a second transfer function from each noise source candidate terminal to the low noise-tolerance terminal.

Noise evaluate portion 234 calculates a noise amount based on the output characteristics of each noise source candidate terminals calculated at circuit analysis portion 220 and the second transfer function provided by transfer function derive portion 232. It compares the noise amount with a noise threshold value provided by analysis condition 204 to specify the noise source terminal that is highly possibly affecting the low noise-resistant terminal, and write it to analysis result 206.

Analysis control portion 240 controls the processes executed by electromagnetic field analysis portion 210, circuit analysis portion 220 and analysis result study portion 230.

Figure 3:
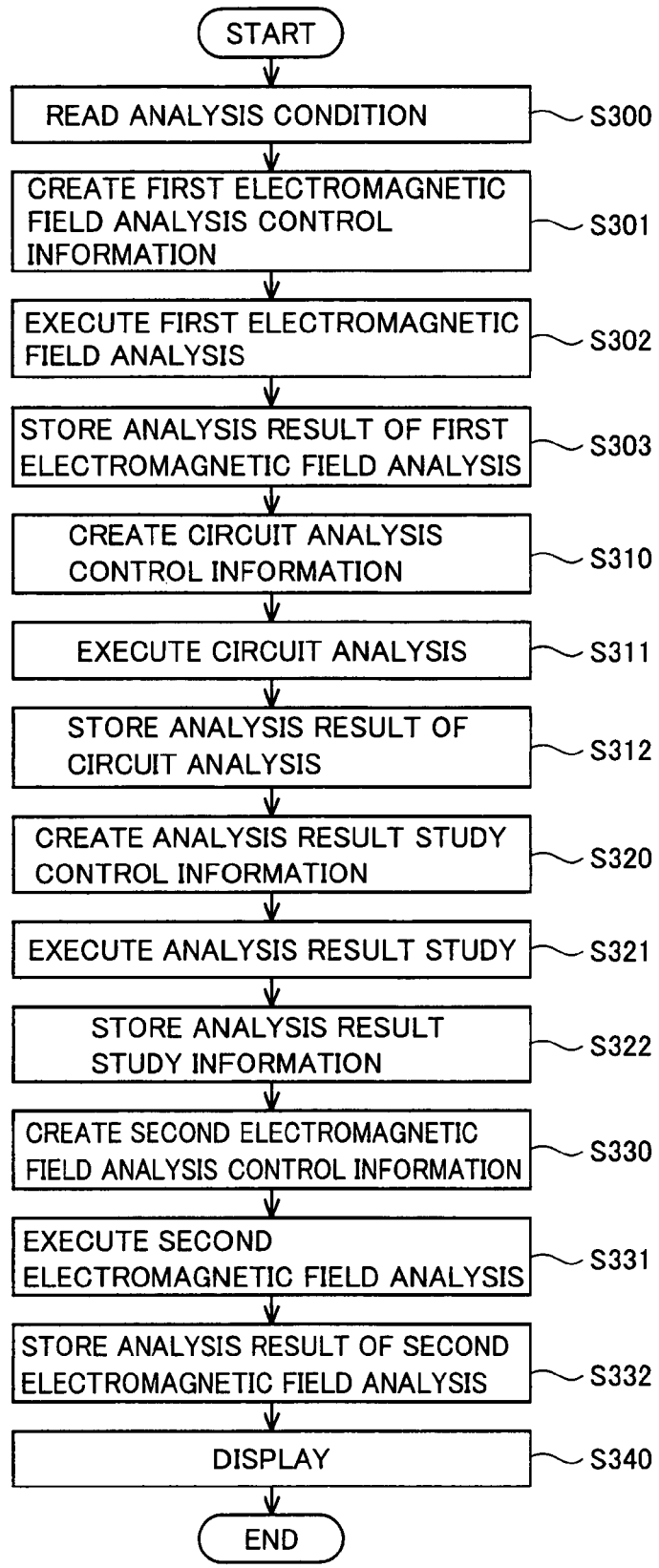
FIG. 3 is a flowchart schematically showing processes performed by simulation apparatus 100.

In the following, referring to FIG. 3, processes executed by simulation apparatus 100 having the above-described configuration will be described. First, the entire processes will schematically be described. Thereafter, respective processes of step S302, step S311, step S321, and step S331 will be described in detail.

In step S300, CPU 120 reads analysis condition 204 from hard disk 124 and stores it on memory 122.

In step S301, CPU 120 creates first electromagnetic field analysis control information according to analysis condition 204 read in step S300, and stores it on memory 122 or in hard disk 124. The first electromagnetic field analysis control information includes information designating the analysis target by a CAD data file name or the like, electromagnetic field analysis conditions, low noise-tolerance signal names, and noise source candidate signal names.

In step S302, CPU 120 executes the first electromagnetic field analysis, setting the low noise-tolerance terminal as a power supply. As the electromagnetic field analysis conditions, the first electromagnetic field analysis control information created in step S301 is designated. In step S302, an impulse waveform may be applied. The impulse waveform has frequency components of a wide band. Accordingly, by the first electromagnetic filed analysis, characteristics can be analyzed over a wide band.

In step S303, CPU 120 stores the analysis result of the first electromagnetic field analysis in analysis result 206. The analysis result of the first electromagnetic field analysis includes information designating the analysis result of the voltage and current values in the low noise-tolerance terminal and the noise source candidate terminals.

In step S310, CPU 120 creates circuit analysis control information for analyzing the output characteristics of the noise source candidates. The circuit analysis control information includes the power supply voltage value, operating frequency, and terminal names of the noise source candidate signals.

In step S311, CPU 120 executes a circuit analysis. Here, as the conditions of the analysis, the circuit analysis control information created in step S310 is designated.

In step S312, CPU 120 stores the analysis result of the circuit analysis in analysis result 206. The analysis result of the circuit analysis includes information designating the analysis result of the voltage and current values of the noise source candidate signals.

It is noted that CPU 120 can execute processes of S301-S303 and processes of S310-S312 independently from each other. Accordingly, these two types of processes may be executed in parallel.

In step S320, CPU 120 creates analysis result study control information to be used in executing the analysis result study process for specifying the noise source. The analysis result study control information includes information designating the first electromagnetic field analysis result and the circuit analysis result by file names or the like, a step width of the frequency domain, and a noise threshold value designated by the analysis condition.

In step S321, CPU 120 executes an analysis result study. Here, as the conditions of the analysis result study, the analysis result study control information created in step S320 is designated.

In step S322, CPU 120 stores the information obtained by the analysis result study in analysis result 206. The information obtained by the analysis result study includes information specifying a signal exceeding the noise threshold value set in advance by analysis condition 204.

In step S330, CPU 120 creates second electromagnetic field analysis control information. The second electromagnetic field analysis control information includes information of the specified noise source signal name stored in analysis result 206 in step S322.

In step S331, CPU 120 executes the second electromagnetic field analysis for specifying a route of a noise crosstalking from the specified noise source. Here, as the analysis conditions, the second electromagnetic field analysis control information created in step S330 is designated.

In step S332, CPU 120 stores the analysis result of the second electromagnetic field analysis in analysis result 206. The analysis result of the second electromagnetic field analysis includes information for designating the second electromagnetic field analysis result.

In step S340, CPU 120 displays the analysis result on monitor 104, and thereafter, terminates processing.

Figure 4:
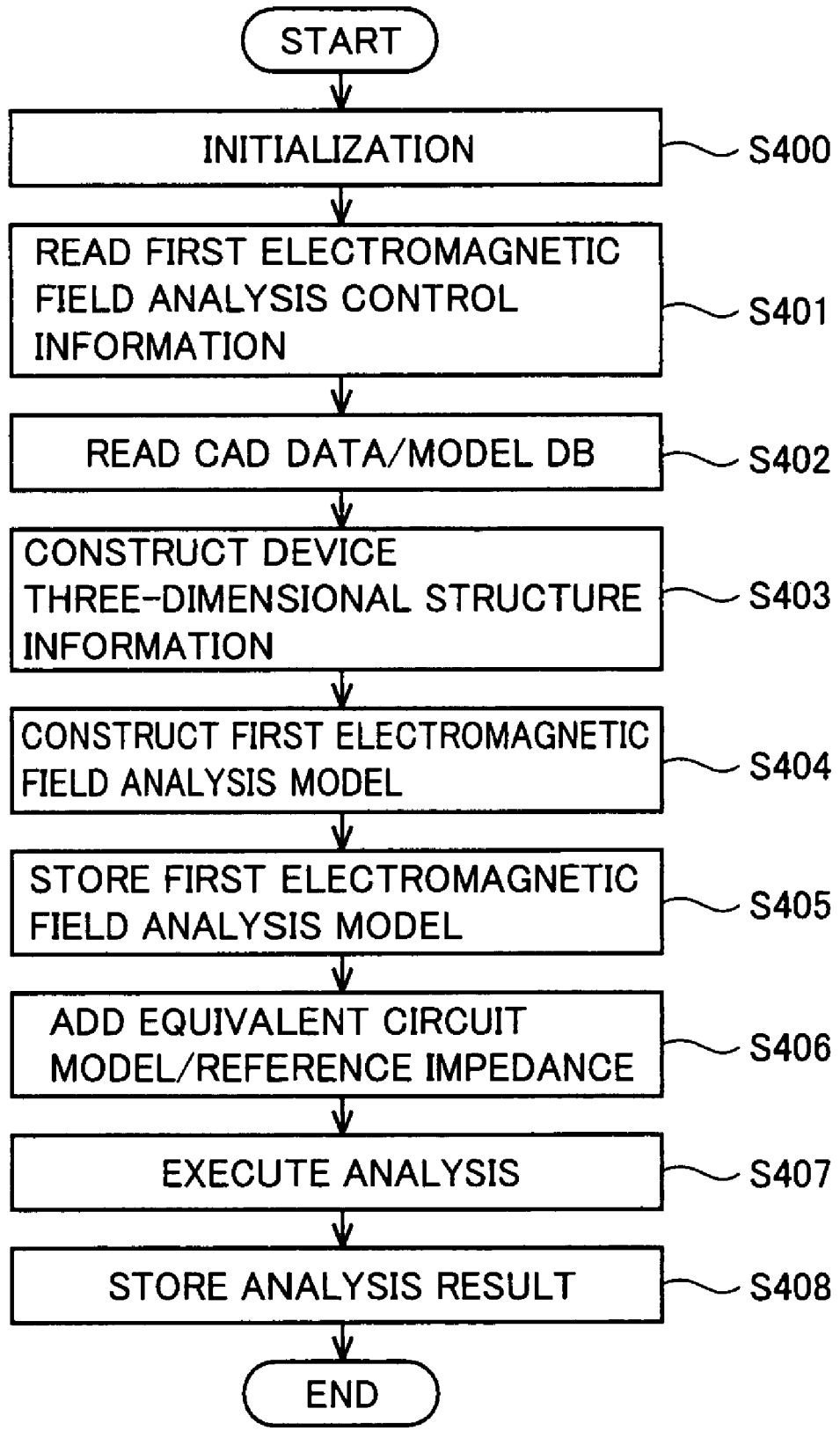
FIG. 4 is a flowchart showing processes in a first electromagnetic field analysis.

Next, referring to FIG. 4, the first electromagnetic field analysis performed in the above-described step S302 will be described.

In step S400, CPU 120 performs an initialization work such as reservation of memory area for storing the first electromagnetic field analysis control information.

In step S401, CPU 120 reads the first electromagnetic field analysis control information created in step S301, and stores it in the area on the memory reserved in step S400.

In step S402, CPU 120 reads CAD data expressing the entire structure of the analysis target device, and structure information and physical property values of each constituent from circuit/substrate CAD data 200 and/or model DB 201.

In step S403, CPU 120 constructs three-dimensional structure information of the device on memory 122. For example, if a printed substrate is the analysis target device, the three-dimensional structure information of the device includes physical property values of materials included in the substrate (dielectric) and a substrate made of a conductor or the like, two-dimensional structure information of each material in each layer, as well as information on the structure in a layered direction (thickness direction) of the printed substrate. These are stored in the substrate CAD data. From the foregoing information, it becomes possible to construct the three-dimensional structure information of the printed substrate alone. The positional information of the printed substrate in the device is shown in the CAD data expressing the entire structure of the device, and therefore the structure of the printed substrate in the entire analysis region can be constructed.

CPU 120 performs such processes to all the constituents, thereby constructing the three-dimensional structure information of the entire device.

In step S404, the three-dimensional structure information of the entire device, and the physical property value information thereof are converted into information that can be subjected to an electromagnetic field analysis. As one example of this process, the FDTD method is used in the present embodiment, as described above. The three-dimensional structure information of the device constructed in step S403 includes the physical property value information of each constituent, based on which the medium satisfying each cell is set.

In step S405, CPU 120 stores the first electromagnetic field analysis model constructed in step S404 in analysis model 205 in hard disk 124.

In step S406, CPU 120 reads from model DB 201 equivalent circuit data corresponding to a component mounted on the printed substrate, and adds it to the first electromagnetic field analysis model in accordance with positional information indicated by the substrate CAD data. Here, in order to obtain the first transfer function from the low noise-tolerance terminal to the noise candidate terminal, CPU 120 executes the following processes to the terminal for which the transfer function is to be obtained.

First, into the low noise-tolerance terminal, a reference impedance to be the reference and a power supply are inserted. Then, into the noise source candidate terminal, a reference impedance for obtaining the transfer function is inserted. In the present embodiment, for all the terminals, resistance of 50Ω is used as the reference impedance.

Figure 2:
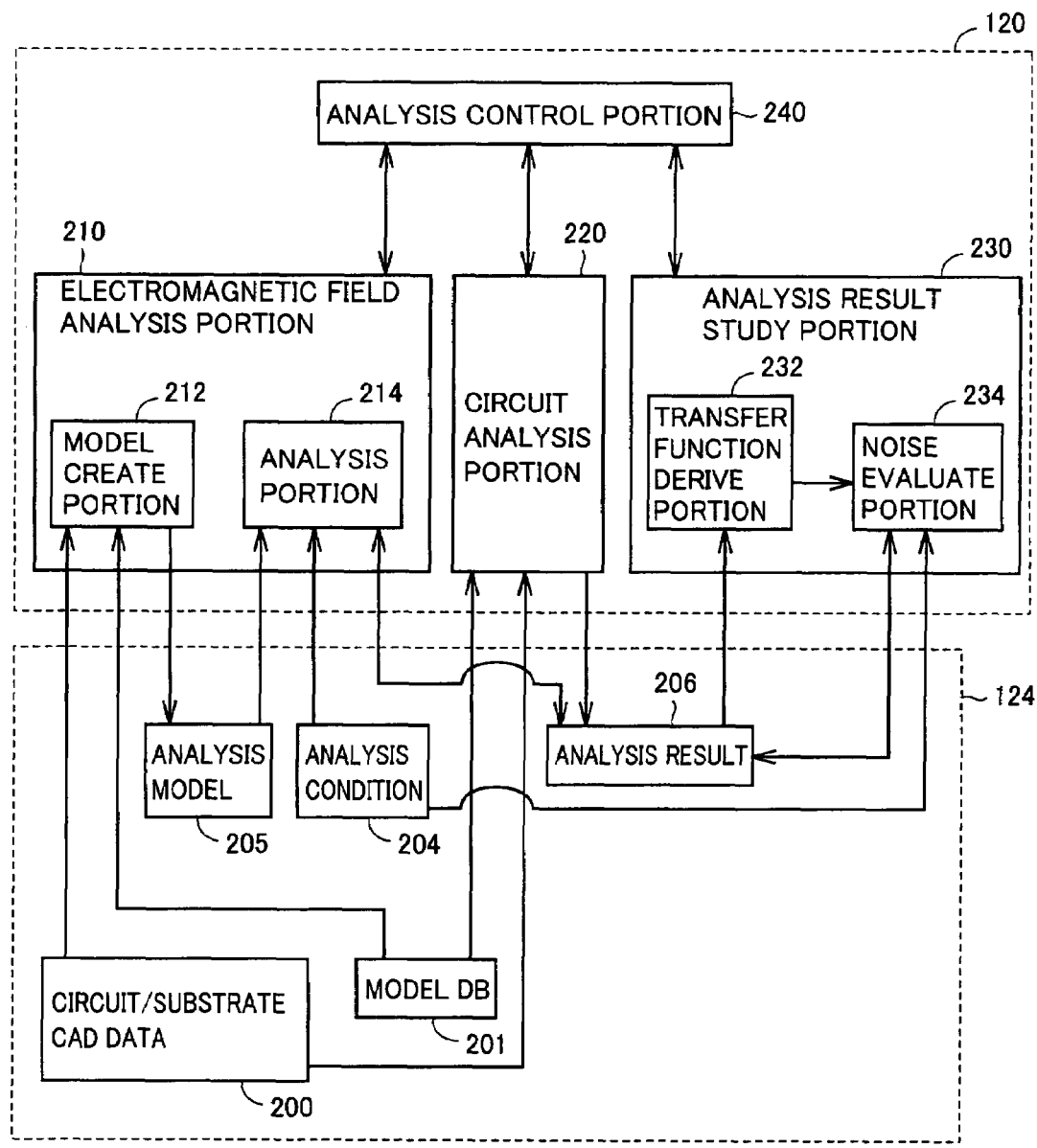
FIG. 2 is a block diagram of a functional configuration of CPU 120.

The foregoing processes in steps S400-S406 are executed by model create portion 212 of electromagnetic field analysis portion 210 shown in FIG. 2.

In step S407, CPU 120 executes an electromagnetic field analysis to the analysis model to which the circuit model is added.

In step S408, CPU 120 stores in analysis result 206 a transient response analysis result as to the voltage and current values of the noise source candidate terminal and of the low noise-tolerance terminal.

Figure 5:
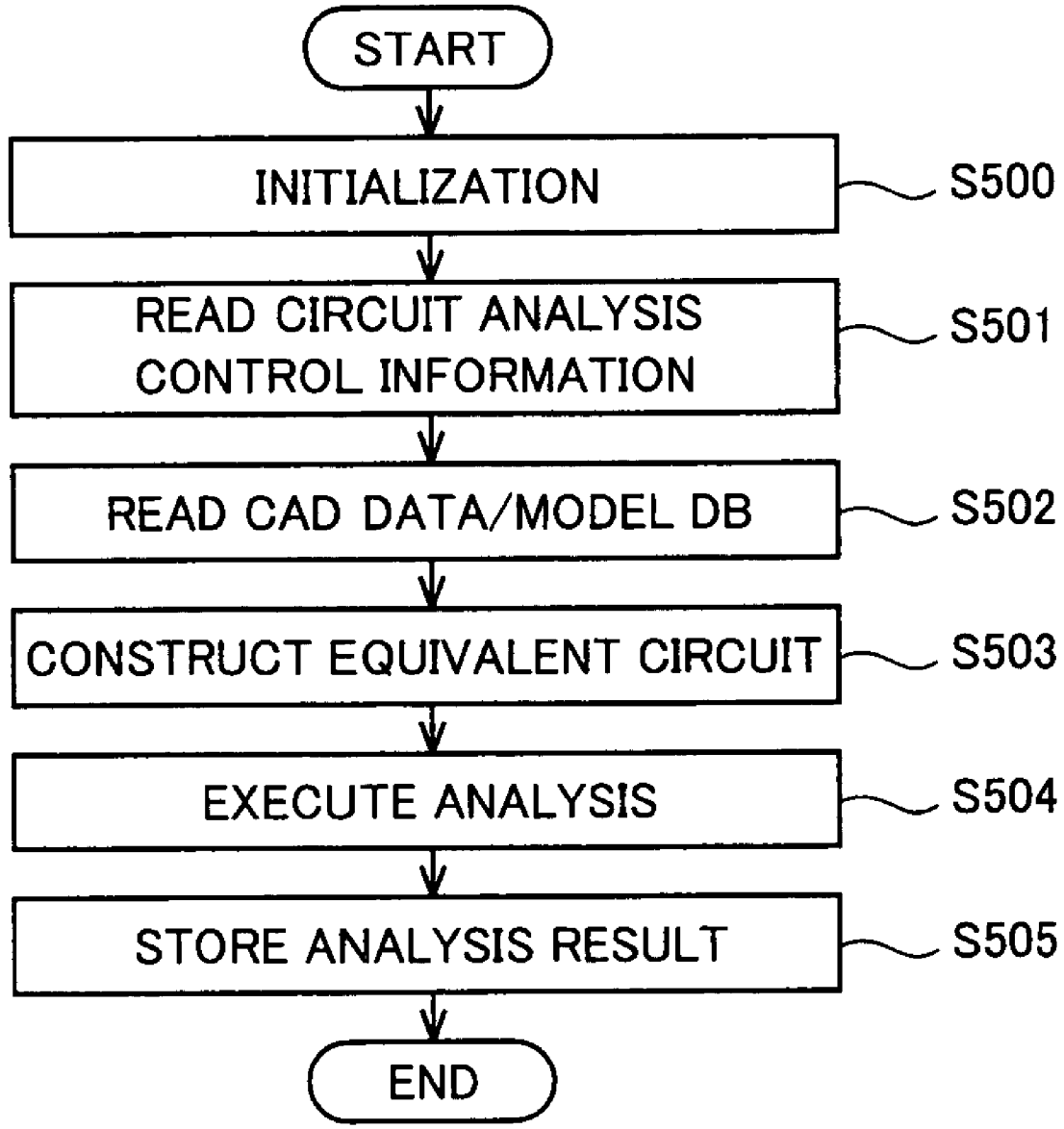
FIG. 5 is a flowchart showing processes in a circuit analysis.

Next, referring to FIG. 5, the circuit analysis performed in the foregoing step S311 will be described.

In step S500, CPU 120 performs an initialization work such as reservation of memory area for storing the circuit analysis control information.

In step S501, CPU 120 reads the circuit analysis control information created in step S310, and stores it on memory 122.

In step S502, CPU 120 reads substrate CAD data storing the wiring structure of noise source candidate signals as well as equivalent circuits of the elements related to the signals from circuit/substrate data 200 and/or model DB 201.

In step S503, CPU 120 extracts wiring structure information of a noise source candidate signal from the substrate CAD data read in step S502, and creates an equivalent circuit model of the wiring. As to the procedure herein, an equivalent circuit model per unit length is calculated, based on wiring cross-section structure information, conductivity of the conductor, and permittivity of the dielectric, which is then connected for the wiring length so that a wiring model is constructed.

In addition to the foregoing wiring model, CPU 120 adds the device equivalent circuit model read in step S502, to create a equivalent circuit model of the noise source candidate signal. It performs the same processes to all the noise source candidate signals designated by the circuit analysis control conditions.

In step S504, CPU 120 performs a circuit analysis of the equivalent circuit model of the noise source candidate signal created in step S503.

In step S505, CPU 120 stores the voltage and current values of the noise source candidate in analysis result 206.

Figure 6:
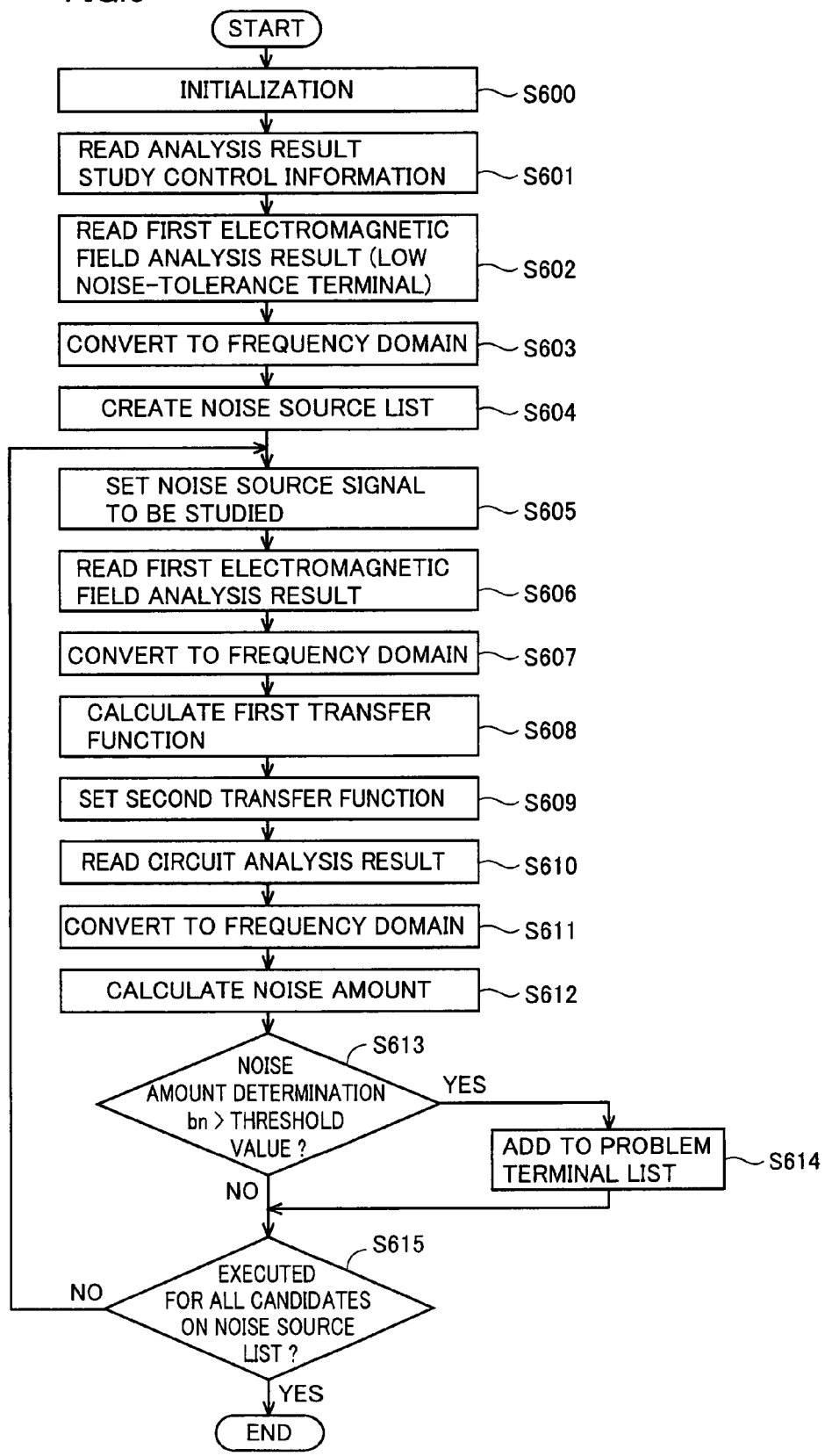
FIG. 6 is a flowchart showing processes studying analysis results.

Next, referring to FIG. 6, detail of the process of studying the analysis result performed in the foregoing step S321 will be described.

In step S600, CPU 120 performs an initialization work such as reservation of memory area for storing the analysis result study control information.

In step S601, CPU 120 reads the analysis result study control information, and stores it on the memory.

In step S602, CPU 120 reads from analysis result 206 the voltage and current values of the low noise-tolerance terminal designated by the analysis result study control information and the first electromagnetic field analysis result designated by the analysis result study control information, and stores them on the memory.

In step S603, CPU 120 converts the voltage and current values read in step S602 into data of a frequency domain, using a scheme such as discrete Fourier transformation. The step width of the frequency herein is designated by the analysis result study control information.

In the following description, the voltage of the low noise-tolerance terminal is denoted by $V_1$, and the current value (frequency domain) thereof is denoted by $I_1$.

If CPU 120 outputs the analysis result as converted into a frequency domain in step S408 in executing the first electromagnetic field analysis, it does not execute the process in step S603 and instead employs the data read in step S602, and goes to the next step.

In step 604, CPU 120 creates a list of noise source candidate signals designated by the analysis result study control information read in step S601.

In step S605, CPU 120 sets respective noise source candidate signals to be studied sequentially, from the noise source candidate list created in step S604.

In step S606, CPU 120 reads from analysis result 206 the first electromagnetic field analysis as to the voltage and current values of the noise source candidate signals set in step S605, and stores them on the memory.

In step S607, CPU 120 converts the voltage and current values stored in step S606 into data of a frequency domain using a scheme such as discrete Fourier transformation, and stores them on the memory. The step width of the frequency herein is designated by the analysis result study control information.

In the following description, the voltage of an n-th noise signal terminal in the list is denoted by $V_n$, and the current value thereof is denoted by $I_n$.

When the first electromagnetic field analysis result is stored by the frequency domain, CPU 120 does not execute the process in step S607 and instead employs the data read in step S606, and goes to the next step.

In step S608, CPU 120 uses the data stored in steps S603 and S607 to calculate $S_{n1}$ component of S-parameters for each frequency using the following expression (1). In the present embodiment, this is referred to as a first transfer function.

$$S_{n1} = \frac{V_2 - I_2 \times Z_0}{V_1 - I_1 \times Z_0} \quad (1)$$

Where, $Z_0$ expresses a reference impedance, which is 50Ω in the present embodiment.

In step S609, CPU 120 sets, based on first transfer function $S_{n1}$ obtained in step S608, a second transfer function $S_{1n}$ that expresses coupling from the noise source candidate to the low noise-tolerance terminal, and stores it on the memory.

Here, for obtaining the coupling from the noise source candidate to the low noise-tolerance terminal, it is necessary to perform the electromagnetic field analysis as many times as the number of the noise source candidates where each noise source candidate is set as a power supply. Accordingly, an enormous time is required for such analyses. Moreover, since the low noise-tolerance candidate is set as a power supply in the first electromagnetic field analysis, only the coupling from the low noise-tolerance terminal to the noise source candidate can be obtained.

However, based on that the transmission path transmitting a signal shows a passive behavior, and that the first and second transfer functions both show the extent of coupling between two signals, although they are different in input and output points, it is assumed that these transfer functions can identically be treated in estimating the noise amount. Therefore, in the present embodiment, the first transfer function obtained in step S608 is set as the second transfer function.

In step S611, CPU 120 reads the voltage and current values of the circuit analysis result output in step S408 for the noise source candidate signal terminal set in step S605, and stores it on the memory.

In step S611, CPU 120 converts the voltage and current values stored in step S610 into frequency domain data using a scheme such as discrete Fourier transformation and stores it on the memory. When the voltage and current values are stored by the frequency domain in step S408, CPU 120 does not execute the process in step S611 and instead employs the data stored in step S610, and goes to the next step.

In step S612, CPU 120 calculates a noise amount $b_n$ crosstalking into the low noise-tolerance terminal based on the voltage and current values in the noise source candidate terminal stored in step S611, using the following expression (2).

$$b_n = S_{1n} \times \frac{V_1 + I_1 \times Z_0}{2 \times \sqrt{Z_0}} \quad (2)$$

In step S613, CPU 120 determines the noise amount. CPU 120 compares the threshold value provided by the analysis result study control information with noise amount $b_n$ calculated using expression (2). When noise amount $b_n$ exceeds the threshold value, it may be highly possibly the noise source. Therefore, the signal name set in step S605 and the noise amount are added to the problem terminal list (step S614).

In step S615, CPU 120 determines whether the analyses have been executed for all the candidates on the noise source list created in step S604. If not executed for all the candidates (NO in step S615), it goes back to the process in step S605. If executed for all the candidates (YES in step S615), it ends processing.

Finally, referring to FIG. 7, detail of the second electromagnetic field analysis executed in the foregoing step S331 will be described.

In step S700, CPU 120 performs an initialization work such as reservation of memory area for storing the analysis conditions and analysis control information.

In step S701, CPU 120 reads the second electromagnetic field analysis control information created in step S330, and stores it in the area on the memory reserved in step S700.

In step S702, CPU 120 reads the first electromagnetic field analysis model stored in step S405, and stores it on the memory.

In step S703, CPU 120 creates a list of the problem terminals based on the second electromagnetic field analysis control information read in step S701.

In step S704, CPU 120 sequentially sets the noise source signals, from the problem terminal list created in step S703.

In step S705, CPU 120 reads from model DB 201 equivalent circuit data corresponding to a component mounted on the printed substrate. Then, according to the positional information indicated by the substrate CAD data, CPU 120 adds it to the first electromagnetic field analysis model read in step S702. Here, CPU 120 sets an equivalent circuit model expressing active circuit properties to the noise source signal terminal set in step S704, sets an equivalent circuit model expressing passive circuit properties to other noise source terminals, and sets an equivalent circuit model to the low noise-tolerance terminal.

For example, if an IBIS (Input/Output Buffer Specification) model is used as the device model expressing the electric property of a component is used, CPU 120 sets active properties (Pullup, Pulldown, Ramp), protection diode properties (POWER, Clamp, GND, Clamp), and passive properties (Package, C_comp) to the equivalent circuit model expressing active circuit properties, and sets protection diode properties and passive properties to the equivalent circuit model expressing the passive circuit properties.

In step S706, CPU 120 executes an electromagnetic field analysis to the analysis model constructed in step S705. Here, an impulse waveform may be applied as the noise source being set in the foregoing.

In step S707, CPU 120 stores the analysis result such as electric and magnetic field intensities and current and voltage values within the analysis range in analysis result 206 in hard disk 124. CPU 120 may execute the analysis result storage in step S707, while executing the electromagnetic field analysis of step S706.

In step S708, CPU 120 determines whether the analyses have been executed for all the terminals on the noise source list. If not executed for all the terminals (NO in step S708), it goes back to the process in step S704. Otherwise (YES in step S708), it ends processing.

As described above, according to the simulation apparatus of the present invention, a route of a noise crosstalking into a low noise-tolerance terminal included in the target of an electromagnetic field analysis can be efficiently analyzed. Specifically, when there are N noise source candidate terminals for a low noise-tolerance terminal, and among them there are M terminals actually applying a noise over a tolerance value (M<N), conventionally it has been necessary to execute the electromagnetic field analysis for N times. On the other hand, in the present invention, the execution can be reduced to (M+1) times in total, that is, the first electromagnetic field analysis once and the second electromagnetic field analysis for M times. Thus, the number of executing the electromagnetic field analysis for specifying the source of noise out of a plurality of possible noise source candidates can be reduced, and the analysis time can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A simulation method of analyzing a route of a noise crosstalking from a plurality of first noise source candidates set in advance as noise source terminals on a circuit substrate to a prescribed terminal, comprising the steps of:

obtaining, by performing a first electromagnetic field analysis of said circuit substrate, a first transfer function expressing coupling from said prescribed terminal to each of said first noise source candidates;

setting, based on said first transfer function, a second transfer function expressing coupling from each of said first noise source candidates to said prescribed terminal;

obtaining an output characteristic of each of said first noise source candidates;

obtaining, based on said second transfer function and said output characteristic of each of said first noise source candidates, intensity of the noise crosstalking from each of said first noise source candidates to said prescribed terminal;

setting said first noise source candidates having the intensity of at least a prescribed value as second noise source candidates;

setting a noise source equivalent circuit to each of said second noise source candidates and performing a second electromagnetic field analysis of said circuit substrate;

sequentially repeating said second electromagnetic field analysis of each of second noise source candidates; and analyzing the route of the noise crosstalking, based on results of said step of sequentially repeating said second electromagnetic field analysis.

2. The simulation method according to claim 1, wherein said step of setting said second transfer function includes a step of setting said first transfer function as a function type of said second transfer function.

3. The simulation method according to claim 2, wherein said first electromagnetic field analysis and second electromagnetic field analysis are executed by Finite Difference Time Domain method, and an impulse waveform is applied as said noise source.

4. A simulation apparatus performing analysis processing of a route of a noise crosstalking from a plurality of first noise source candidates set in advance as noise source terminals on a circuit substrate to a prescribed terminal, comprising:

means for obtaining, by performing a first electromagnetic field analysis of said circuit substrate, a first transfer function expressing coupling from said prescribed terminal to each of said first noise source candidates;

means for setting, based on said first transfer function, a second transfer function expressing coupling from each of said first noise source candidates to said prescribed terminal;

means for obtaining an output characteristic of each of said first noise source candidates;

means for obtaining, based on said second transfer function and said output characteristic of each of said first noise source candidates, intensity of the noise crosstalking from each of said first noise source candidates to said prescribed terminal;

means for setting said first noise source candidates having the intensity of at least a prescribed value as second noise source candidates;

means for setting a noise source equivalent circuit to each of said second noise source candidates and performing a second electromagnetic field analysis of said circuit substrate;

means for sequentially repeating said second electromagnetic field analysis of each of said second noise source candidates; and means for analyzing the route of the noise crosstalking, based on results of said means for sequentially repeating said second electromagnetic field analysis.

5. A computer readable medium storing a simulation program for causing a computer to execute analysis processing of a route of a noise crosstalking from a plurality of first noise source candidates set in advance as noise source terminals on a circuit substrate to a prescribed terminal, said simulation program causes the computer to execute the steps of:

obtaining, by performing a first electromagnetic field analysis of said circuit substrate, a first transfer function expressing coupling from said prescribed terminal to each of said first noise source candidates;

setting, based on said first transfer function, a second transfer function expressing coupling from each of said first noise source candidates to said prescribed terminal;

obtaining an output characteristic of each of said first noise source candidates;

obtaining, based on said second transfer function and said output characteristic of each of said first noise source candidates, intensity of the noise crosstalking from each of said first noise source candidates to said prescribed terminal;

setting said first noise source candidates having the intensity of at least a prescribed value as second noise source candidates;

setting a noise source equivalent circuit to each of said second noise source candidates and performing a second electromagnetic field analysis of said circuit substrate;

sequentially repeating said second electromagnetic field analysis of each of said second noise source candidates; and analyzing the route of the noise crosstalking, based on results of said step of sequentially repeating said second electromagnetic field analysis.

* * * * *